United States Patent
Ducreux

(10) Patent No.: US 7,321,138 B2
(45) Date of Patent: Jan. 22, 2008

(54) PLANAR DIAC

(75) Inventor: Gérard Ducreux, Luynes (FR)

(73) Assignee: STMicroelectronics S.A., Montrouge (FR)

( * ) Notice: Subject to any disclaimer, the term of this patent is extended or adjusted under 35 U.S.C. 154(b) by 0 days.

(21) Appl. No.: 10/398,419

(22) PCT Filed: Oct. 12, 2001

(86) PCT No.: PCT/FR01/03179

§ 371 (c)(1),
(2), (4) Date: Apr. 7, 2003

(87) PCT Pub. No.: WO02/31889

PCT Pub. Date: Apr. 18, 2002

(65) Prior Publication Data

US 2004/0012034 A1    Jan. 22, 2004

(30) Foreign Application Priority Data

Oct. 13, 2000 (FR) ................................ 00 13180

(51) Int. Cl.
*H01L 29/861* (2006.01)
(52) U.S. Cl. ............ 257/109; 257/119; 257/551; 257/E29.335; 257/E29.337
(58) Field of Classification Search ........ 257/109–112, 257/119–131, 173, 174, 551, E29.335, E29.337
See application file for complete search history.

(56) References Cited

U.S. PATENT DOCUMENTS

| | | | | |
|---|---|---|---|---|
| 3,615,929 A | * | 10/1971 | Portnoy et al. ............ | 438/5 |
| 4,267,527 A | * | 5/1981 | Petrizio et al. ............ | 331/111 |
| 4,405,932 A | * | 9/1983 | Ishii et al. ............... | 257/497 |
| 4,847,671 A | * | 7/1989 | Pattanayak et al. ........ | 257/144 |
| 4,967,256 A | * | 10/1990 | Pathak et al. ............. | 257/112 |
| 5,880,511 A | | 3/1999 | Yu et al. | |
| 5,932,921 A | * | 8/1999 | Sakai et al. .............. | 257/419 |
| 5,955,750 A | * | 9/1999 | Byatt .................... | 257/110 |
| 6,693,021 B1 | * | 2/2004 | Motoki et al. ............. | 438/481 |

FOREIGN PATENT DOCUMENTS

DE    2625710 A    12/1977

OTHER PUBLICATIONS

Derwent abstract for US 4405932.*

(Continued)

*Primary Examiner*—Marcos D. Pizarro
(74) *Attorney, Agent, or Firm*—Lisa K. Jorgenson; James H. Morris; Wolf, Greenfield & Sacks, P.C.

(57) ABSTRACT

The invention concerns an asymmetric diac comprising a highly-doped substrate (21) of a first type of conductivity, a lightly-doped epitaxial layer (22) of the second type of conductivity on the upper surface of the substrate (21), a highly-doped region (24) of the first type of conductivity on the side of the upper surface of the epitaxial layer, a region (23) of the second type of conductivity more doped than the epitaxial layer beneath the region (24) of the first type of conductivity and not overlapping relative thereto, a channel retaining ring (25) of the second type of conductivity more doped than the epitaxial layer, outside the first region, and a wall (26) of the first type of conductivity outside said ring, joining the substrate.

14 Claims, 3 Drawing Sheets

OTHER PUBLICATIONS

International Search Report from PCT priority application No. PCT/FR01/03179 filed Oct. 12, 2001.
Patent Abstracts of Japan vol. 12, No. 232 (E-628), Jun. 30, 1998 & JP 63 023359, Jan. 30, 1998.

International Preliminary Examination Report from priority PCT application No. PCT/FR01/93179, filed Oct. 12, 2001.

* cited by examiner

PLANAR DIAC

BACKGROUND OF THE INVENTION

1. Field of the Invention

The present invention aims at novel diac structures especially enabling easing the assembly of such components.

2. Discussion of the Related Art

A conventional diac structure is shown in FIG. 1. The structure is formed from a substrate 1 of a first conductivity type, here type P. On either side of the substrate are formed heavily-doped regions of the opposite type, here, type N, respectively 2 and 3. To obtain a sufficiently high breakdown voltage, the so-called mesa technology is used, which consists of etching grooves at the border between two diacs formed in a same wafer. The angle formed by the groove at the location where it cuts the junction between the P and $N^+$ regions is an important parameter for determining the breakdown voltage at the component periphery. Another important parameter is the choice of the passivation product 4 formed in the grooves.

The upper and lower surfaces of the diac are covered with metallizations M1 and M2. Conventionally, a diac is a device of small size, its thickness being smaller than 0.3 mm and its surface being on the order of 0.5 mm×0.5 mm.

Special packages are thus provided for the diacs, for example, piston systems arranged on either side of a glass tube in which the chip is enclosed.

To avoid difficulties associated with the mesa technology and with the digging of grooves, it has been attempted to make diacs of planar type, for example, such as that shown in FIG. 2, also formed from a P-type substrate 1. The upper and lower surfaces of the substrate are coated with a masking layer, for example, silicon oxide, respectively 11 and 12, provided with a central opening through which is formed an $N^+$-type diffused region, respectively 13 and 14. These planar structures enable obtaining satisfactory planar structures of the junction peripheries, but pose assembly problems. Indeed, it becomes difficult to weld the chip on a metal support wafer since, in case the welding extends laterally beyond its location, a short-circuit is created between one of the $N^+$ regions and the P substrate. Metallizations must thus be provided, for example formed of silver balls 15 and 16, located on $N^+$ regions 13 and 14, which complicates the assembly and increases its cost.

Thus, to assemble a diac of planar type such as that of FIG. 2, very specific packages and assembly modes must be provided.

FIG. 3 illustrates the typical characteristic of a diac. Such a component cannot be assimilated to two head-to-tail zener diodes. Indeed, the existence, when one of the junctions is in avalanche, of another forward junction which injects into the substrate, causes a breakover type effect. Thus, the diac breaks down when the voltage thereacross reaches a value VBO. The voltage then drops to an intermediary voltage Vf as long as the current is in a given range of values. The voltage across the diac rises back if the current comes out of this range. In the example shown in FIG. 3, the value of voltage VBO is 32 volts, the value of voltage Vf is 13 volts, the current at the breakover time is on the order of 0.3 µA (that is, the diac has very slight leaks), and the current corresponding to voltage Vf is in a range on the order of from 10 to 100 milliamperes.

A diac, such as those shown in FIGS. 1 and 2, has a symmetrical characteristic, as shown in FIG. 3. The value of voltage VBO essentially depends on the doping levels of the junctions between the $N^+$ regions and the P substrate. The value of forward voltage Vf essentially depends on the doping level and on the thickness of substrate 1, which can be considered as the floating base of a transistor having its emitter and collector corresponding to the $N^+$ regions. This base must be such that the carriers injected by the forward junction can cross it. The carrier lifetime must thus be long in the base if its width is large, that is, it must be lightly doped. If the base dimension becomes small, the carrier lifetime in this base must be reduced, for example by a metallic diffusion. These various compromises determine above-mentioned voltage Vf.

Generally, semiconductor manufacturers are asked to provide diacs having well established values of VBO and Vf. For example, a diac having a voltage VBO of 32 V±12%, with a voltage drop from VBO to Vf of a minimum 10 V, and with an asymmetry smaller than a few percents of the considered values, will be desired.

SUMMARY OF THE INVENTION

An object of the present invention is to form such a diac which is easy to manufacture, that is, which is of planar type and not of mesa type, and which is easily assembled on a connection grid including a base on which a surface of the component is welded.

To achieve this and other objects, the present invention provides an asymmetrical disc including a substrate of a first conductivity type with a high doping level, a lightly-doped epitaxial layer of the second conductivity type on the upper surface of the substrate, a heavily-doped region of the first conductivity type on the upper surface side of the epitaxial layer, a region of the second conductivity type more heavily doped than the epitaxial layer under the region of the first conductivity type and that does not extend beyond said layer, a channel stop ring of the second conductivity type more heavily doped than the epitaxial layer, outside of the first region, and a wall of the first conductivity type outside of said ring, joining the substrate.

According to an embodiment of the present invention, the first conductivity type is type N.

The present invention also provides an assembly forming a symmetrical diac including two asymmetrical diacs such as above mentioned, in antiparallel.

According to an embodiment of the present invention, the assembly includes a first diac welded by its rear surface to a first conductive wafer, a second diac welded by its rear surface on a second conductive layer, the upper surface of each diac being welded to the conductive wafer supporting the other diac.

The foregoing objects, features and advantages of the present invention, will be discussed in detail in the following non-limiting description of specific embodiments in connection with the accompanying drawings, in which:

DETAILED DESCRIPTION

Figure 1:
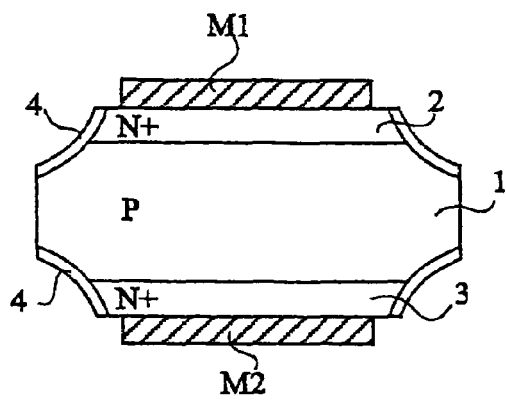
FIG. 1 shows a mesa-type diac structure according to prior art.
Figure 2:
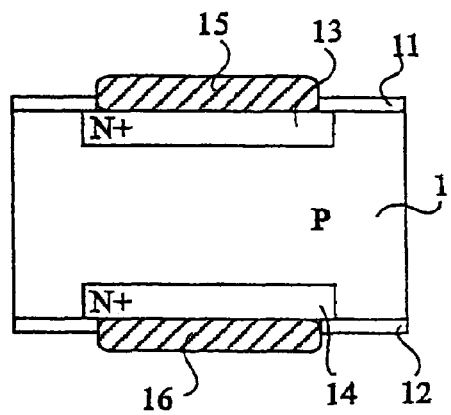
FIG. 2 shows a planar-type diac structure according to prior art.
Figure 3:
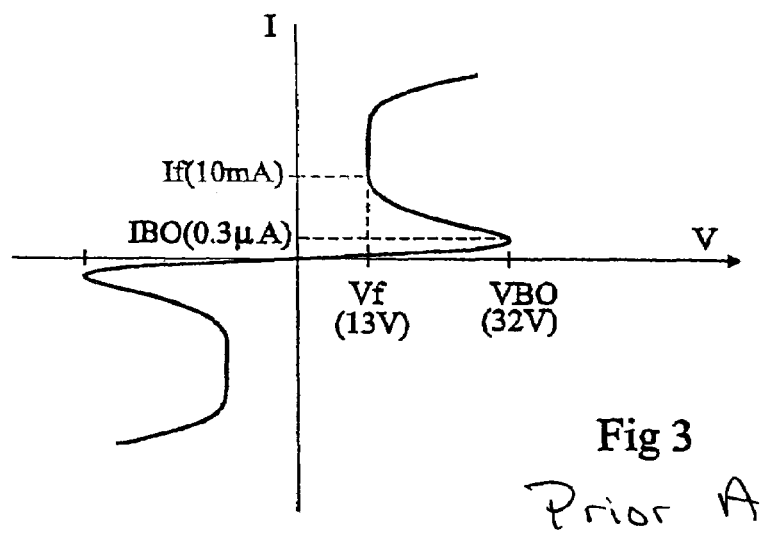
FIG. 3 shows the current/voltage characteristic of a diac.
Figure 4:
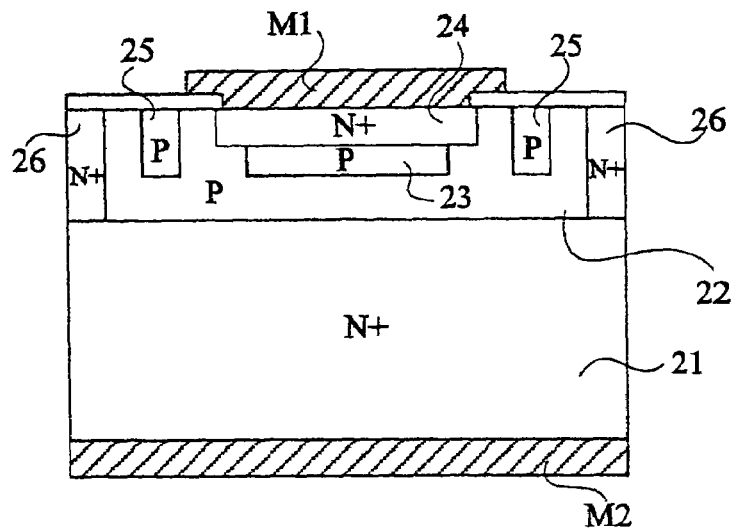
FIG. 4 is a simplified cross-section view of a diac structure according to the present invention.

As shown in FIG. 4, the present invention provides forming a diac on a structure including a heavily-doped substrate 21 of a first conductivity type, which will be considered hereafter as being type N. A P-type epitaxial layer 22 is formed on this substrate. A region 23 more heavily doped than region 22 is formed in epitaxial layer 22, through a first mask. An N-type region 24 extending on all sides beyond region 23 and more heavily doped than region 23 is formed above region 23, through a second mask. Thus, a portion of P-type doped region 23 remains under N-type region 24. At the periphery of region 24, and separately therefrom, a P-type ring 25 is formed, which has a channel stop function. The component periphery is occupied by a heavily-doped N-type wall 26, which crosses epitaxial layer 22 and joins substrate 21. Wall 26 is external to ring 25 and is separate therefrom. This wall is formed immediately after epitaxial layer 22.

A metallization M1 is formed on the upper surface of N+ region 24 and a metallization M2 is formed on the lower surface of N+ substrate 21. Thus, a diac is obtained between metallizations M1 and M2. Channel stop region 25 has the function of avoiding for leakage currents to flow in a region located under the upper surface of epitaxial layer 22 from metallization M1 to metallization M2 via wall 26 and substrate 21. Wall 26 has the function of avoiding for the junction between substrate 21 and epitaxial layer 22 to emerge on the outside of the component.

The first junction of the diac corresponds to the junction between N+ region 24 and P region 23, and the second junction of the diac corresponds to the junction between epitaxial layer 22 and substrate 21. The structure of this diac enables metallization M2 to be welded on a metal base possibly belonging to a connection grid. Indeed, even if weldings extend laterally, and up on the diac walls, they cannot create short-circuits since the lateral walls are uniformly of type N+ like the layer in contact with metallization M2.

Figure 5:
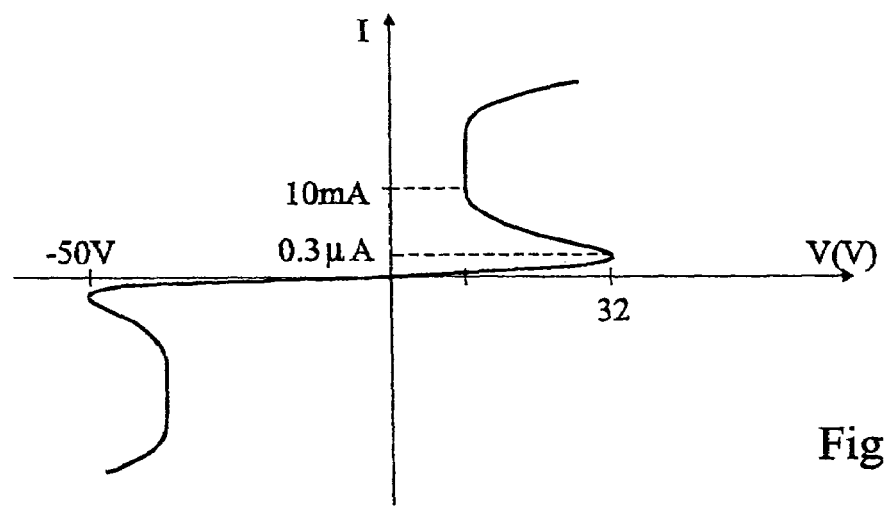
FIG. 5 shows the current/voltage characteristic of a diac according to the present invention.

It should be noted, as illustrated in FIG. 5, that the diac according to the present invention has an asymmetrical characteristic. The breakdown voltage of the junction located on the upper surface side is smaller than the breakdown voltage of the junction located on the lower surface side. This is due to the fact that P region 23, which sets with N+ region 24 the positive avalanche voltage (taking metallization M2 as a reference) is more heavily doped than P epitaxial layer 22, which sets with N+ region 21 the negative breakdown voltage (still taking metallization M2 as a reference).

Such an asymmetrical diac can have advantages in some types of applications.

Figure 6:
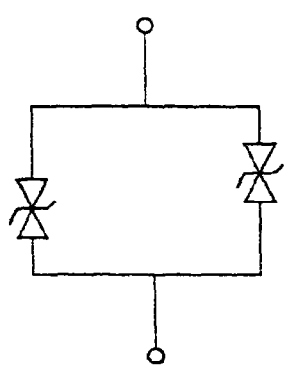
FIG. 6 illustrates the assembly diagram of a diac according to the present invention.
Figure 7:
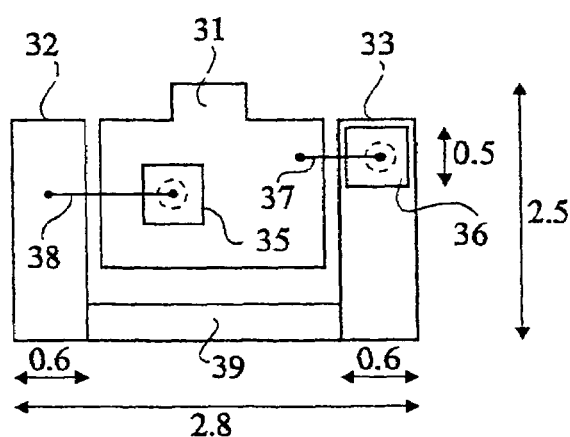
FIG. 7 shows an assembly of diacs in antiparallel according to the present invention.

However, if a diac with a symmetrical breakdown voltage is desired to be formed, this is perfectly possible, by assembling two diacs according to the present invention in antiparallel, as shown in FIG. 6. This can be done by using a preexisting connection grid used for transistors of small size including, after cutting-up, as shown in FIG. 7, a base 31, and two electrode strips 32 and 33. Two diacs 35 and 36 are welded by their rear surface respectively on base 31 and, for example, on strip 33. The upper surface of diac 36 is welded by a wire 37 to base 31 and the upper surface of diac 35 is welded by a wire 38 to strip 32. By providing a short-circuit between strips 32 and 33, two head-to-tail diacs in antiparallel are obtained between strip 31 forming the first electrode of the assembly and short-circuit 39, which corresponds to the assembly of FIG. 6. Thus, a perfectly symmetrical equivalent diac is present between strip 31 and short-circuit 39, corresponding to the assembly of FIG. 6, having identical positive and negative breakdown voltages. The embodiment of FIG. 7 is an example only. Generally, a first diac welded by its rear surface to a first conductive wafer, a second diac welded by its rear surface to a second conductive wafer, will be provided, the upper surface of each of the diacs being welded to the conductive wafer supporting the other diac.

Figure 8:
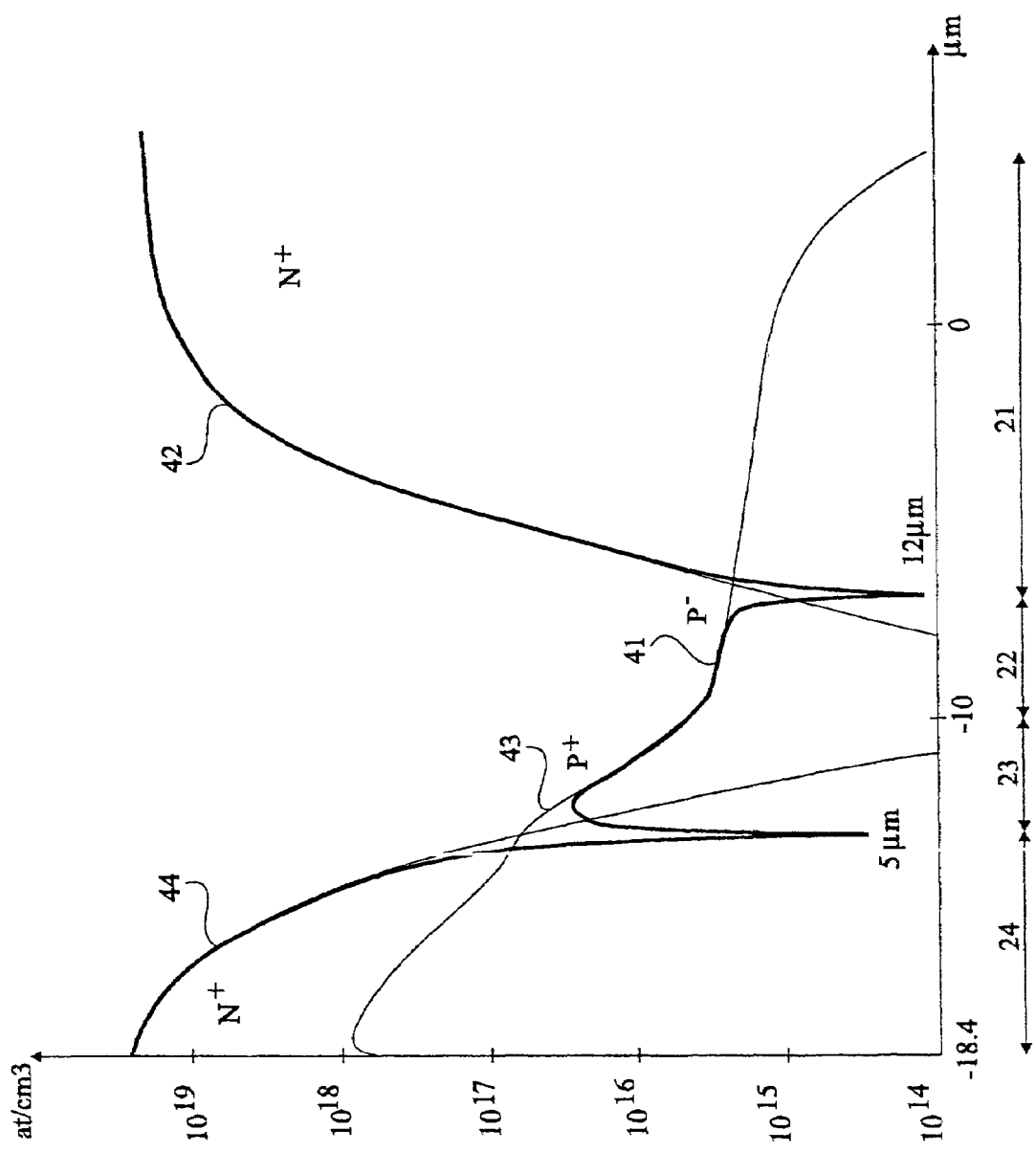
FIG. 8 shows a diffusion profile of an example of forming of a diac according to the present invention.

FIG. 8 illustrates an example of a doping profile of a diac according to the present invention having a characteristic such as shown in FIG. 5.

In FIG. 8, the abscissas correspond to vertical distances in micrometers, value "0" corresponding to the upper surface of the N+ substrate on which the P-type epitaxial layer is developed. The profile of this epitaxial layer corresponds to what is indicated by reference 41. During the epitaxy, an N+-type region of substrate 21 diffuses according to the curve designated by reference 42. Curve 43 corresponds to the P-type diffusion formed from the upper surface, and curve 44 corresponds to N+-type diffusion 24 formed from the upper surface.

The references corresponding to the various regions have been indicated under the abscissas. Thus, N+-type layer 24 extends at approximately 5 µm under the upper surface of the epitaxial layer, and P-type region 23 and P-type layer 22 extend down to substantially 12 µm from the epitaxial layer surface. The doping level of P-type layer 22 at the junction with substrate 21 is approximately $2.10^{15}$ atoms/cm$^3$ and the doping level of P-type layer 23 at the interface with N+-type region 24 is on the order of $8.10^{17}$ atoms/cm$^3$.

Of course, the doping profile of FIG. 8 is an example only and the various doping materials may be optimized according to the desired diac characteristics.

Having thus described at least one illustrative embodiment of the invention, various alterations, modifications, and improvements will readily occur to those skilled in the art. Such alterations, modifications, and improvements are intended to be within and scope of the invention. Accordingly, the foregoing description is by way of example only and is not intended as limiting. The invention is limited only as defined in the following claims and the equivalents thereto.

What is claimed is:

1. An asymmetrical diac including:
   a substrate of a first conductivity type with a high doping level,
   a lightly-doped epitaxial layer of the second conductivity type on the upper surface of the substrate,
   a heavily-doped first region of the first conductivity type on an upper surface side of the epitaxial layer,
   a second region of the second conductivity type more heavily doped than the epitaxial layer under the first region of the first conductivity type and that does not extend beyond said first region,
   a channel stop ring of the second conductivity type more heavily doped than the epitaxial layer, outside of the first region, and
   a wall of the first conductivity type outside of said ring, joining the substrate;
   wherein the diac is configured to have a first breakdown voltage for voltages of a first polarity and a second breakdown voltage for voltages of a second, opposite polarity, wherein the first and second breakdown voltages are voltages of different magnitudes.

2. The diac of claim 1, wherein the first conductivity type is type N.

3. The diac of claim 2, wherein the second conductivity type is type P.

4. An assembly forming a symmetrical diac including two asymmetrical diacs of claim 1, in antiparallel.

5. The assembly of claim 4, further comprising a first diac welded by its rear surface to a first conductive wafer, a second diac welded by its rear surface to a second conductive layer, an upper surface of each diac being welded to the conductive wafer supporting the other diac.

6. An asymmetrical diac, comprising:
   a substrate of a first conductivity type having a high doping concentration;
   a first region of a second conductivity type having a light doping concentration disposed on the substrate;
   a second region of the first conductivity type having a heavy doping concentration disposed on the first region;
   a third region of the second conductivity type having a doping concentration greater than the doping concentration of the first region being disposed under the second region;
   a channel stop ring of the second conductivity type having a doping concentration greater than the first region disposed outside of the second region; and
   a wall of the first conductivity type outside of said ring, joining the substrate;
   wherein the asymmetrical diac is a three-layer npn or pnp diac;
   wherein the diac is configured to have a first breakdown voltage for voltages of a first polarity and a second breakdown voltage for voltages of a second, opposite polarity, wherein the first and second breakdown voltages are voltages of different magnitudes.

7. The diac of claim 6, wherein the first conductivity type is N.

8. The diac of claim 6, wherein the second conductivity type is type P.

9. The diac of claim 6, wherein the third region forms a junction with the second region.

10. The diac of claim 6, wherein the third region is centered with respect to the second region.

11. The diac of claim 6, wherein the third region is the only region of the second conductivity type having a doping concentration greater than the doping concentration of the first region that is disposed under the second region.

12. The diac of claim 6, wherein the second region is the only semiconductor region of the diac that contacts a first metallization of the diac.

13. An assembly forming a symmetrical diac including two asymmetrical diacs of claim 6, in antiparallel.

14. The assembly of claim 13, wherein a first diac is disposed on a first conductive wafer, a second diac is disposed on a second conductive layer and a first surface of each diac is attached to the conductive wafer supporting the other diac.

* * * * *